(12) United States Patent
Okamoto

(10) Patent No.: US 9,712,152 B2
(45) Date of Patent: Jul. 18, 2017

(54) CIRCUIT FOR CONTROLLING POWER SUPPLY

(71) Applicant: Socionext Inc., Yokohama-shi, Kanagawa (JP)

(72) Inventor: Atsushi Okamoto, Hachioji (JP)

(73) Assignee: SOCIONEXT INC., Yokohama (JP)

( * ) Notice: Subject to any disclaimer, the term of this patent is extended or adjusted under 35 U.S.C. 154(b) by 44 days.

(21) Appl. No.: 14/862,240

(22) Filed: Sep. 23, 2015

(65) Prior Publication Data

US 2016/0099642 A1   Apr. 7, 2016

(30) Foreign Application Priority Data

Oct. 3, 2014   (JP) .................................. 2014-204939

(51) Int. Cl.
*H03K 3/01*  (2006.01)
*H03K 17/16*  (2006.01)
*H03K 19/00*  (2006.01)

(52) U.S. Cl.
CPC ....... *H03K 17/162* (2013.01); *H03K 19/0016* (2013.01); *H03K 2217/0018* (2013.01); *H03K 2217/0036* (2013.01)

(58) Field of Classification Search
CPC ......... G05F 3/205; G11C 5/146; G11C 5/145; H02M 2003/078; H02M 3/07; H02M 3/073; H02M 2003/071; H02M 2003/072; H02M 2003/075; H02M 2003/076; H02M 2003/077; H03K 19/0027; H03K 2217/0018

USPC .................................................. 327/534–537
See application file for complete search history.

(56) References Cited

U.S. PATENT DOCUMENTS

| | | | | |
|---|---|---|---|---|
| 6,559,708 | B2 * | 5/2003 | Notani | H03K 19/0016 327/534 |
| 7,705,625 | B2 * | 4/2010 | Yoo | G11C 11/4074 326/26 |
| 7,978,004 | B2 * | 7/2011 | Houston | H03K 17/687 327/534 |
| 2001/0013806 | A1 | 8/2001 | Notani | |
| 2008/0094889 | A1 | 4/2008 | Kurotsu | |
| 2008/0296977 | A1 | 12/2008 | Kawasaki | |

FOREIGN PATENT DOCUMENTS

| | | |
|---|---|---|
| JP | 07-212217 | 8/1995 |
| JP | 2001-230664 | 8/2001 |
| JP | 2008-103927 | 5/2008 |
| JP | 2008-300696 | 12/2008 |

\* cited by examiner

*Primary Examiner* — Lincoln Donovan
*Assistant Examiner* — Diana J Cheng
(74) *Attorney, Agent, or Firm* — Arent Fox LLP

(57) ABSTRACT

A circuit for controlling power supply includes a first switch situated between a first power supply and a first node coupled to a circuit block, a second switch situated between a second power supply having a voltage value different than the first power supply and a second node coupled to a back gate of a transistor of the circuit block, a third switch situated between the first node and the second node, and a control unit configured to place the second switch in an "on" state and the third switch in an "off" state during an "on" state of the first switch, and to place the second switch in an "off" state and the third switch in an "on" state during an "off" state of the first switch.

11 Claims, 13 Drawing Sheets

CIRCUIT FOR CONTROLLING POWER SUPPLY

CROSS-REFERENCE TO RELATED APPLICATIONS

The present application is based upon and claims the benefit of priority from the prior Japanese Patent Application No. 2014-204939 filed on Oct. 3, 2014, with the Japanese Patent Office, the entire contents of which are incorporated herein by reference.

FIELD

The disclosures herein relate to a power supply control circuit and a semiconductor device.

BACKGROUND

A power gating method that suspends power supply to a certain circuit block for the purpose of reducing power consumption in a semiconductor device is known in the art (see Patent Document 1, for example). Further, a technology to apply a bias voltage to the back gate of a transistor is known in the art (see Patent Documents 2, 3, and 4, for example).
[Patent Document 1] Japanese Laid-open Patent Publication No. 2008-300696
[Patent Document 2] Japanese Laid-open Patent Publication No. 2001-230664
[Patent Document 3] Japanese Laid-open Patent Publication No. 2008-103927
[Patent Document 4] Japanese Laid-open Patent Publication No. H7-212217

SUMMARY

According to an aspect of the embodiment, a circuit for controlling power supply includes a first switch situated between a first power supply and a first node coupled to a circuit block, a second switch situated between a second power supply having a voltage value different than the first power supply and a second node coupled to a back gate of a transistor of the circuit block, a third switch situated between the first node and the second node, and a control unit configured to place the second switch in an "on" state and the third switch in an "off" state during an "on" state of the first switch, and to place the second switch in an "off" state and the third switch in an "on" state during an "off" state of the first switch.

According to an aspect of the embodiment, a semiconductor device includes a circuit block, a first switch situated between a first power supply and a first node coupled to the circuit block, a second switch situated between a second power supply having a voltage value different than the first power supply and a second node coupled to a back gate of a transistor of the circuit block, a third switch situated between the first switch and the second switch, and a control unit configured to place the second switch in an "on" state and the third switch in an "off" state during an "on" state of the first switch, and to place the second switch in an "off" state and the third switch in an "on" state during an "off" state of the first switch.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
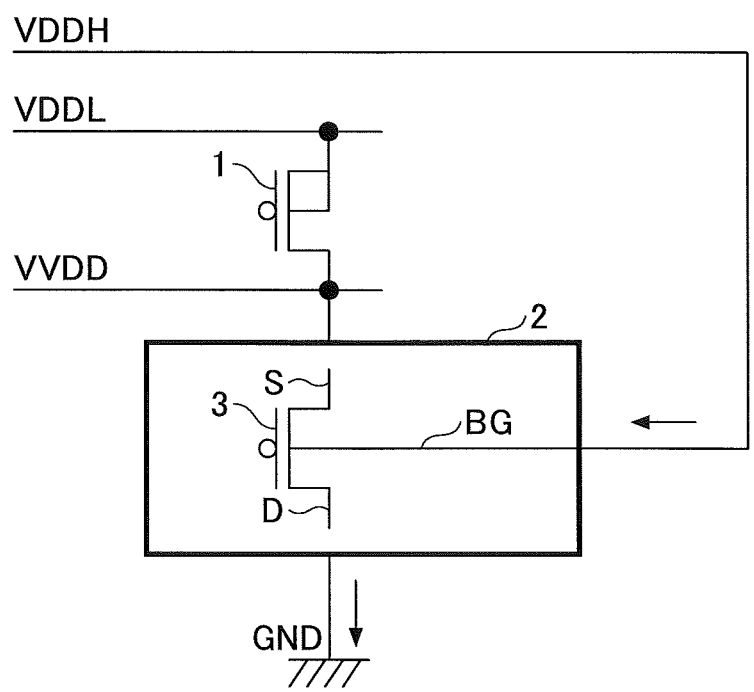
FIG. 1 is a drawing illustrating an example of the configuration of a semiconductor device.

FIG. 1 is a drawing illustrating an example of a semiconductor device in which power gating is performed to suspend power supply to a circuit block by use of a switch. A back gate BG of a transistor 3 in a circuit block 2 receives a bias voltage VDDH that is higher than a power supply voltage VDDL. Upon a switch 1 being turned on, a pseudo power supply voltage VVDD becomes equal to the power supply voltage VDDL, so that electric power at the power supply voltage VDDL is supplied to the circuit block 2 (i.e., when the power gating function is "off"). The power gating function is turned on when the status of the switch 1 is changed from "on" to "off". As a result, the pseudo power supply voltage VVDD applied to the circuit block 2 is set substantially equal to zero volt, so that power supply to the circuit block 2 is suspended.

Since the back gate BG of the transistor 3 receives the bias voltage VDDH, the change of the pseudo power supply voltage VVDD to approximately zero volt results in the voltage difference being increased between the back gate BG and each of a source S and a drain D of the transistor 3. This causes an increase in a leak current flowing from the back gate BG to each of the source S and the drain D of the transistor 3. Power consumption of the semiconductor device is thus large despite the activation of the power gating function.

In the following, embodiments will be described with reference to the accompanying drawings.

Figure 2:
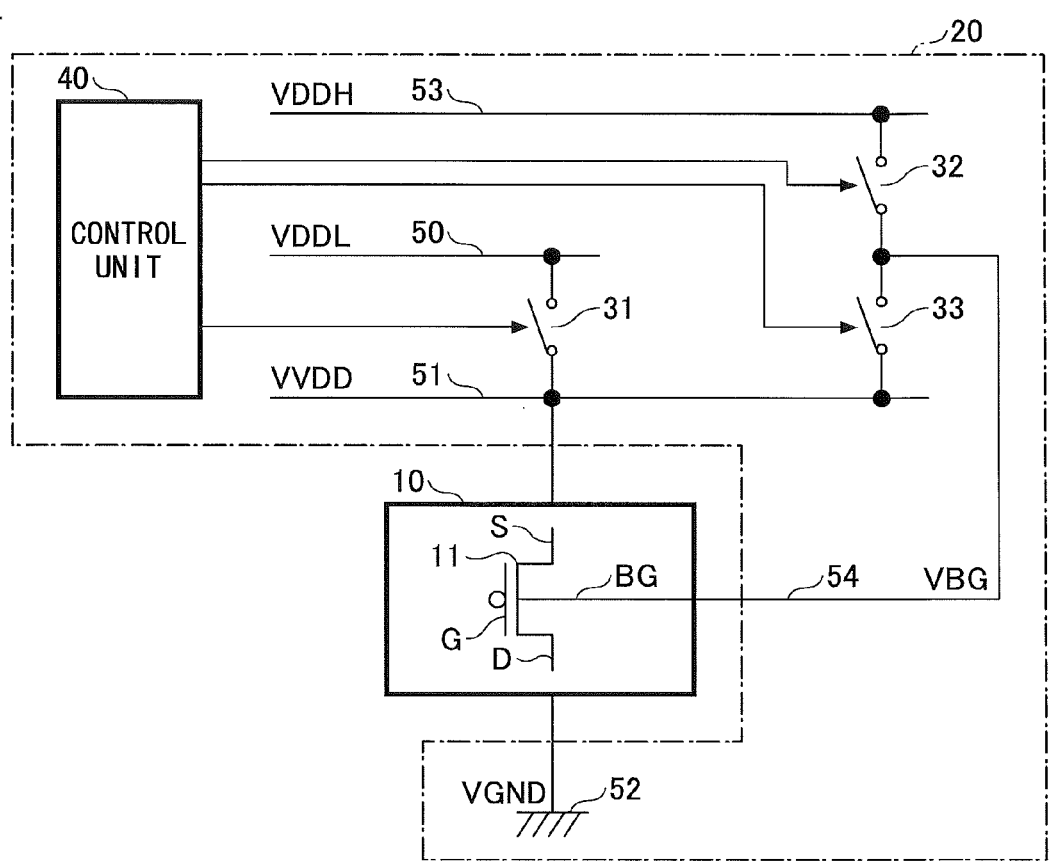
FIG. 2 is a drawing illustrating an example of the configuration of a semiconductor device.

FIG. 2 is a drawing illustrating an example of the configuration of a semiconductor device. A semiconductor device 101 may be an LSI (large scale integration) circuit, for example. The semiconductor device 101 includes a circuit block 10 and a power supply control circuit 20.

The circuit block 10 is a circuit subjected to power gating, and includes at least one field-effect transistor 11. The field-effect transistor 11 may be a P-channel-type MOS (metal oxide semiconductor) transistor that has a gate G, a source S, a drain D and a back gate BG.

The power supply control circuit 20 serves to control power gating that suspends power supply to the circuit block 10. The power supply control circuit 20 includes a switch 31, a switch 32, a switch 33 and a control unit 40.

The switch 31 is an example of a first switch that is situated between a power supply 50 and a node 51. The switch 31 may be a semiconductor switching device connected in series between the power supply 50 and the node 51.

The power supply 50 is an example of a first power supply, and may be a low-potential power supply that supplies the direct-current power of the power supply voltage VDDL. The power supply 50 may be an electric conductive part such as a power supply terminal, a power supply line or a power supply pattern. The power supply voltage VDDL is a potential difference between the power supply 50 and a ground 52.

The ground 52 has a ground potential VGND, and may be an electric conductive part such as a ground terminal, a ground line or a ground pattern. The ground 52 is coupled to a lower-potential-side current path through which a circuit current flowing out of the circuit block 10 flows. The ground 52 is directly or indirectly coupled to the drain D of the field-effect transistor 11.

The node 51 is an example of a first node that is coupled to the circuit block 10. The node 51 serves as a pseudo power supply coupled to the circuit block 10, and may be a pseudo electric conductive part such as a pseudo power supply terminal, a pseudo power supply line or a pseudo power supply pattern. The node 51 is coupled to a higher-potential-side current path through which a circuit current flowing into the circuit block 10 flows. The node 51 is directly or indirectly coupled to the source S of the field-effect transistor 11. The circuit block 10 is connected between the node 51 and the ground 52.

The switch 32 is an example of a second switch that is situated between a high-bias power supply 53 and a node 54. The switch 32 may be a semiconductor switching device connected in series between the high-bias power supply 53 and the node 54.

The high-bias power supply 53 is an example of a second power supply having a different voltage value than the power supply 50. The high-bias power supply 53 may be a high-potential power supply that has a voltage value higher than the voltage value of the power supply 50. The high-bias power supply 53 supplies a direct-current power at a high-bias power supply voltage VDDH. The high-bias power supply 53 may be an electric conductive part such as a power supply terminal, a power supply line or a power supply pattern. The high-bias power supply voltage VDDH is a potential difference between the high-bias power supply 53 and the ground 52, and is higher than the power supply voltage VDDL.

The node 54 is an example of a second node that is coupled to the back gate BG of the field-effect transistor 11 in the circuit block 10. The node 54 serves as a voltage applying unit operable to apply a bias voltage VBG to the back gate BG of the field-effect transistor 11. The node 54 is an electric conductive part such as a terminal, a line or an electric conductive pattern.

The switch 33 is an example of a third switch that is situated between the node 51 and the node 54. The switch 33 may be a semiconductor switching device connected in series between the node 51 and the node 54.

The control unit 40 turns on and off the switch 32 and the switch 33, respectively, when tuning on the switch 31. The control unit 40 turns off and on the switch 32 and the switch 33, respectively, when turning off the switch 31. The control unit 40 generates control signals for turning on or off the respective switches 31, 32 and 33.

The "on" state of the switch 31 causes the pseudo power supply voltage VVDD of the node 51 to be set equal to the power supply voltage VDDL, thereby causing the power supply voltage VDDL to be applied to the circuit block 10. Since the power of the power supply voltage VDDL is being supplied to the circuit block 10, the power gating function for the circuit block 10 is in an "off" state. When the switch 31 is turned on, the switch 32 is turned on, and the switch 33 is turned off. As a result, the bias voltage VBG of the node 54 is set equal to the high-bias power supply voltage VDDH, which causes the high-bias power supply voltage VDDH to be applied to the back gate BG of the field-effect transistor 11.

The "off" state of the switch 31 causes the pseudo power supply voltage VVDD of the node 51 to be set equal to the ground voltage VGND, thereby causing approximately zero volt to be applied to the circuit block 10. Since no power is being supplied to the circuit block 10, the power gating function for the circuit block 10 is in an "on" state. When the switch 31 is turned off, the switch 32 is turned off, and the switch 33 is turned on. This results in the bias voltage VBG of the node 54 being set to the same voltage as the pseudo power supply voltage VVDD. Further, the "off" state of the switch 31 causes the pseudo power supply voltage VVDD to be set equal to the ground voltage VGND, thereby causing the bias voltage VBG to be set equal to the ground voltage VGND. As a result, the ground voltage VGND is applied to the back gate BG of the field-effect transistor 11.

As described above, with the power gating function being in the "on" state with respect to the circuit block 10 due to the "off" state of the switch 31, the field-effect transistor 11 has the source S and the drain D thereof set to the ground voltage VGND, and also has the back gate BG thereof set to the same ground voltage VGND. The voltage between the back gate BG and the source S and the voltage between the back gate BG and the drain D are both set substantially equal to zero volt. This arrangement suppresses leak currents flowing through the junction point between the back gate BG and the source S and flowing through the junction point between the back gate BG and the drain D. The semiconductor device 101 thus achieves a reduction in power consumption.

The switch 33 is in the "on" state when the switch 32 is in the "off" state. In this case, the back gate BG of the field-effect transistor 11 is not set to a floating potential, but is set to the pseudo power supply voltage VVDD (which is equal to the ground voltage VGND due to the "off" state of the switch 31). This arrangement prevents noise from being easily superimposed on the node 54 or the back gate BG of the field-effect transistor 11, thereby preventing the occurrence of latch-up resulting from such noise.

Figure 3:
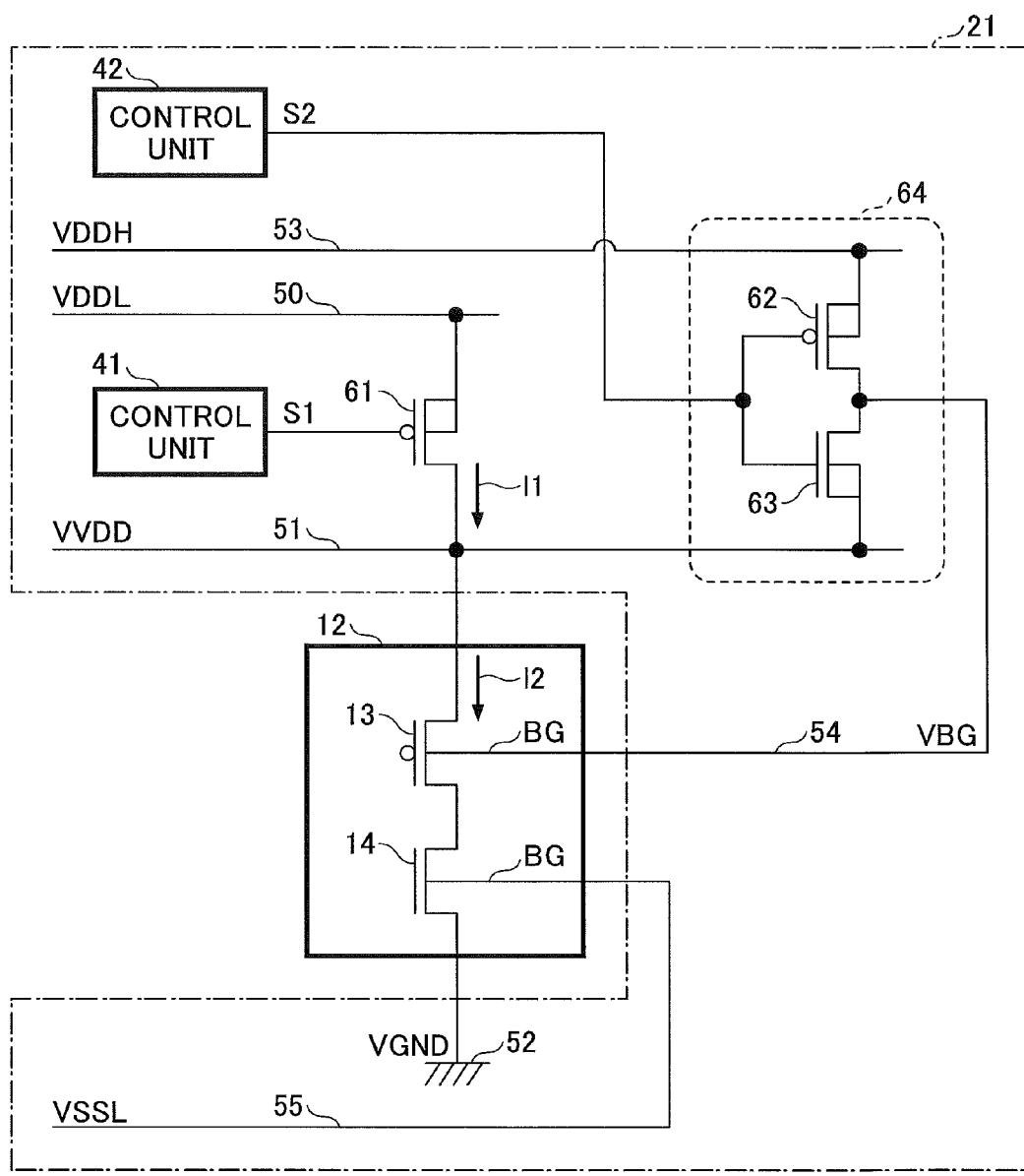
FIG. 3 is a drawing illustrating an example of the configuration of a semiconductor device.

FIG. 3 is a drawing illustrating an example of the configuration of a semiconductor device. Descriptions of configurations and functions identical or similar to those of the semiconductor device 101 previously described will be incorporated herein. The semiconductor device 102 includes a circuit block 12 and a power supply control circuit 21.

The circuit block 12 is a specific example of the circuit block 10 illustrated in FIG. 2. The circuit block 12 is an example of a combinatorial circuit that includes a PMOS transistor 13 and an NMOS transistor 14. The PMOS transistor is a P-channel-type MOS field-effect transistor, and the NMOS transistor is an N-channel-type MOS field-effect transistor.

The PMOS transistor 13 has a source coupled to the node 51, a drain coupled to the drain of the NMOS transistor 14, and a back gate BG coupled to the node 54.

The NMOS transistor 14 has a source coupled to the ground 52, a drain coupled to the drain of the PMOS transistor 13, and a back gate BG coupled to a low-bias power supply 55.

The low-bias power supply 55 is a low-potential power supply having a voltage value lower than the ground 52, and has a low-bias power supply voltage VSSL that is applied to the back gate BG of the NMOS transistor 14. The low-bias power supply 55 may be an electric conductive part such as a power supply terminal, a power supply line or a power supply pattern. The low-bias power supply voltage VSSL is a potential difference between the low-bias power supply 55 and the ground 52. The low-bias power supply voltage VSSL is equal to the ground voltage VGND or is a negative voltage lower than the ground voltage VGND.

The power supply control circuit 21 serves to control power gating that suspends power supply to the circuit block 12. The power supply control circuit 21 includes a PMOS transistor 61, a PMOS transistor 62, an NMOS transistor 63, a control unit 41, and a control unit 42.

The PMOS transistor 61, the PMOS transistor 62, and the NMOS transistor 63 are specific examples of the switch 31, the switch 32, and the switch 33, respectively, illustrated in FIG. 2. The PMOS transistor 62 and the NMOS transistor 63 are transistors included in a CMOS inverter 64. The term "CMOS" is an abbreviation of "complementary MOS".

The PMOS transistor 61 includes a gate coupled to the control unit 41, a source and a back gate coupled to the power supply 50, and a drain coupled to the node 51. The PMOS transistor 62 includes a gate coupled to the control unit 42, a source and a back gate coupled to the high-bias power supply 53, and a drain coupled to the node 54. The NMOS transistor 63 includes a gate coupled to the control unit 42, a source and a back gate coupled to the node 51, and a drain coupled to the node 54.

The control units 41 and 42 are an example of the control unit 40 illustrated in FIG. 2. The control unit 41 serves to output a control signal S1 for driving the PMOS transistor 61. The control unit 42 serves to output a control signal S2 for driving the CMOS inverter 64.

The control unit 41 may be a PMU (i.e., power management unit) receiving electric power from the power supply 50, and operates with the power supply voltage VDDL. Operating with the power supply voltage VDDL rather than the high-bias power supply voltage VDDH, the control unit 41 supplies to the gate of the PMOS transistor 61 the control signal S1 whose high level is equal to the power supply voltage VDDL. Since the operating voltage of the control unit 41 is the power supply voltage VDDL, the high level of the control signal S1 is equal to the power supply voltage VDDL. The fact that the control unit 41 operates with the power supply voltage VDDL allows the breakdown voltage of the gate of the PMOS transistor 61 to be lower than the high-bias power supply voltage VDDH.

The control unit 42 may be a PMU receiving electric power from the high-bias power supply 53, and operates with the high-bias power supply voltage VDDH. Operating with the high-bias power supply voltage VDDH, the control unit 42 supplies to the gate of the PMOS transistor 62 and to the gate of the NMOS transistor 63 the control signal S2 whose high level is equal to the high-bias power supply voltage VDDH.

Figure 4:
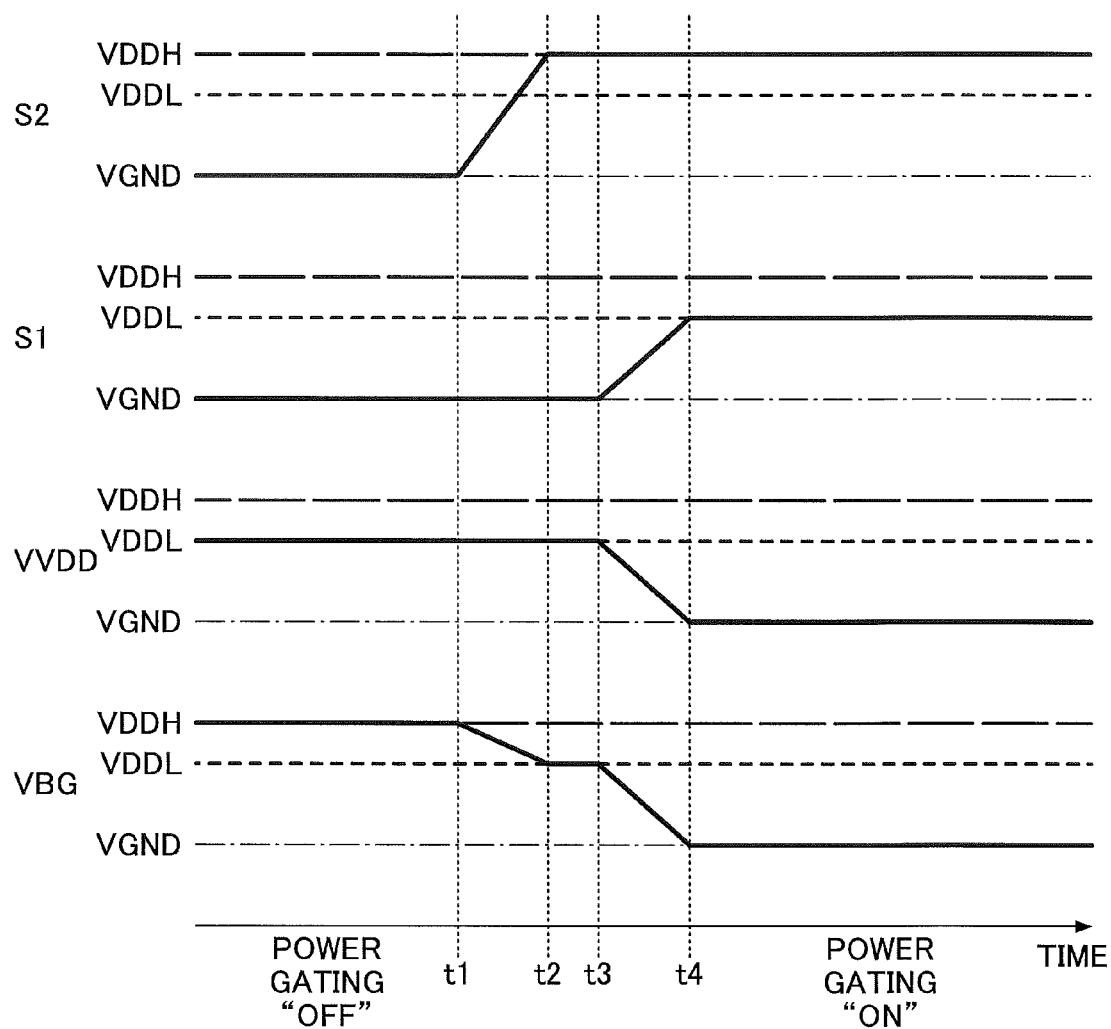
FIG. 4 is a timing chart illustrating an example of the operation of the semiconductor device illustrated in FIG. 3.

FIG. 4 is a timing chart illustrating an example of the operation of the semiconductor device 102. A description of FIG. 4 will be given by referring to FIG. 3. A period t1-t2 during which the control signal S2 changes from the low level to the high level may or may not overlap (as illustrated in FIG. 4) a period t3-t4 during which the control signal S1 changes from the low level to the high level.

The power supply voltage VDDL may be 1.0 V. The high-bias power supply voltage may be 1.5 V. The ground voltage VGND may be 0 V. The gate threshold voltage of each transistor may be 0.6 V.

In the case of the voltage level of the control signal S1 being at the low level equal to the ground voltage VGND, the PMOS transistor 61 is in the "on" state, so that the pseudo power supply voltage VVDD at the node 51 is equal to the power supply voltage VDDL. In the case of the voltage level of the control signal S2 being at the low level equal to the ground voltage VGND, the PMOS transistor 62 is in the "on" state, and the NMOS transistor 63 is in the "off" state, so that the bias voltage VBG at the node 54 is equal to the high-bias power supply voltage VDDH.

In other words, electric power is supplied to the circuit block 12 during the period preceding timing t1 in which the voltage level of the control signal S1 is at the low level equal to the ground voltage VGND. In this case, the power gating function is in the "off" state.

As the voltage level of the control signal S2 changes from the low level equal to the ground voltage VGND to the high level equal to the high-bias power supply voltage VDDH, the PMOS transistor 62 is turned off, and the NMOS transistor 63 is turned on. As a result, the bias voltage VBG of the node 54 drops from the high-bias power supply voltage VDDH to the power supply voltage VDDL.

In the case of the voltage level of the control signal S1 being at the high level equal to the power supply voltage VDDL, the PMOS transistor 61 is in the "off" state, so that the pseudo power supply voltage VVDD at the node 51 is equal to the ground voltage VGND. A leak current I1 of the PMOS transistor 61 is balanced with a leak current I2 of the circuit block 12 by the PMOS transistor 61. However, the conductance of the PMOS transistor 61 is smaller than the conductance of the circuit block 12. The voltage between the source and the drain of the PMOS transistor 61 thus becomes closer and closer to the power supply voltage VDDL, and, also, the voltage across the circuit block 12 becomes closer and closer to the ground voltage VGND. This results in the pseudo power supply voltage VVDD at the node 51 being set substantially equal to the ground voltage VGND.

In the case of the voltage level of the control signal S2 being at the high level equal to the high-bias power supply voltage VDDH, the PMOS transistor 62 is in the "off" state, and the NMOS transistor 63 is in the "on" state, so that the bias voltage VBG at the node 54 is equal to the pseudo power supply voltage VVDD (which is the ground voltage VGND in this case).

In other words, electric power is not supplied to the circuit block 12 during the period following timing t4 in which the voltage level of the control signal S1 is at the high level equal to the power supply voltage VDDL. In this case, the power gating function is in the "on" state.

Accordingly, with the power gating function of the circuit block 12 being in the "on" state, the source and the drain of the PMOS transistor 13 are both set to the ground voltage VGND, and the back gate BG thereof is also set to the ground voltage VGND. The voltage between the back gate BG and the source S and the voltage between the back gate BG and the drain D are both set substantially equal to zero volt. This arrangement suppresses leak currents flowing through the junction point between the back gate BG and the source and flowing through the junction point between the back gate BG and the drain. The semiconductor device 102 thus achieves a reduction in power consumption.

Figure 5:
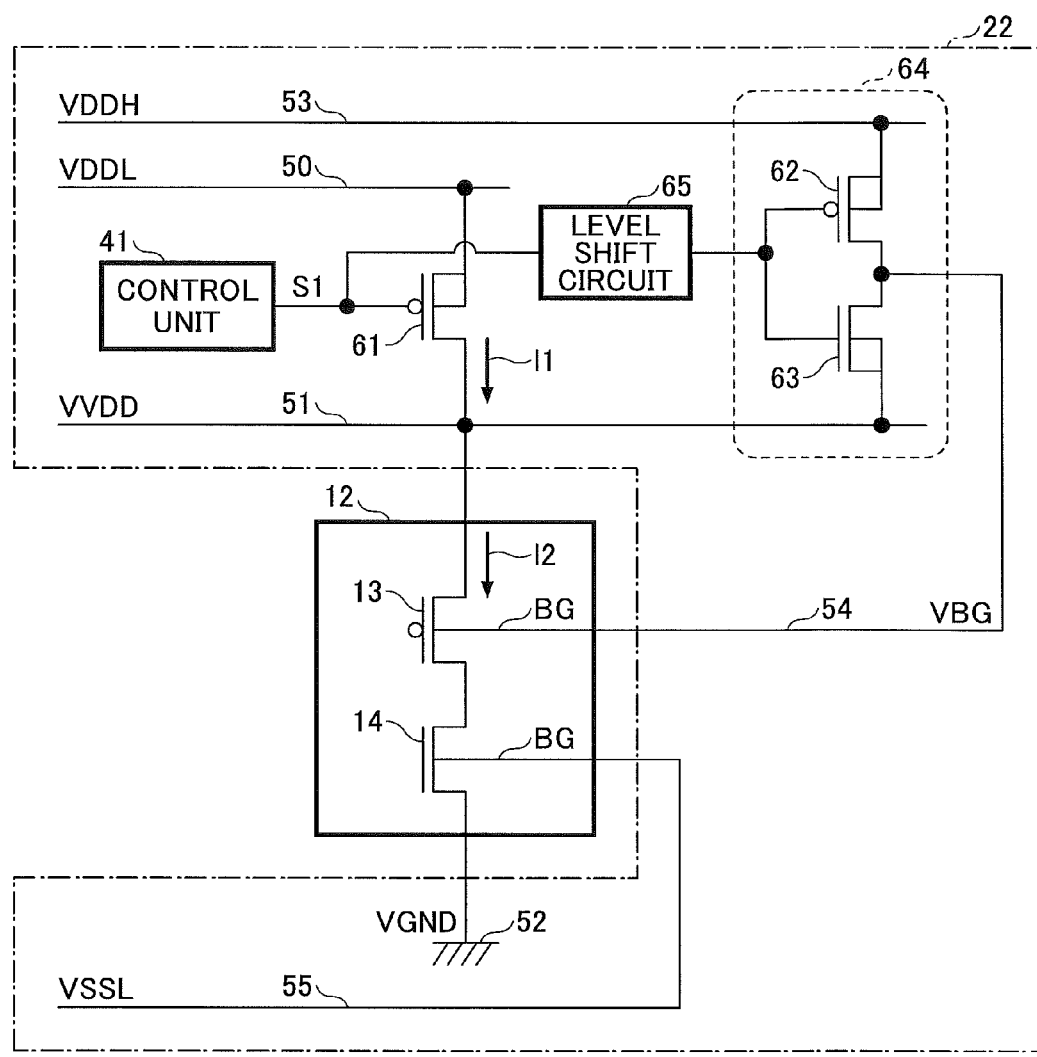
FIG. 5 is a drawing illustrating an example of the configuration of a semiconductor device.

FIG. 5 is a drawing illustrating an example of the configuration of a semiconductor device. Descriptions of configurations and functions identical or similar to those of the semiconductor device 101 or 102 previously described will be incorporated herein.

The control unit 41 outputs the control signal S1 for driving both the PMOS transistor 61 and the CMOS inverter 64. The sharing of the control signal S1 allows the single control unit 41 to perform both the control to shut the flow of current from the power supply 50 to the node 51 and the control to shut the flow of current from the high-bias power supply 53 to the node 54. In other words, the number of control units is reduced despite the multiplicity of systems in which power supply should be suspended. This also contributes to a reduction in the power consumption of the semiconductor device 103.

The semiconductor device 103 has a level shift circuit 65 situated between the control unit 41 and the CMOS inverter 64. The level shift circuit 65 shifts the voltage of the high level of the control signal S1 applied to the CMOS inverter 64 such that the voltage is changed from the power supply voltage VDDL to the high-bias power supply voltage VDDH. With this arrangement, an erroneous "on" state of the PMOS transistor 62 due to the excessively low potential applied to the gate of the PMOS transistor 62 of the CMOS inverter 64 can be prevented when the PMOS transistor 61 is in the "off" state. Namely, an increase of the leak current flowing into the back gate BG of the PMOS transistor 13 caused by the erroneous "on" state of the PMOS transistor 62 is avoided or suppressed.

Figure 6:
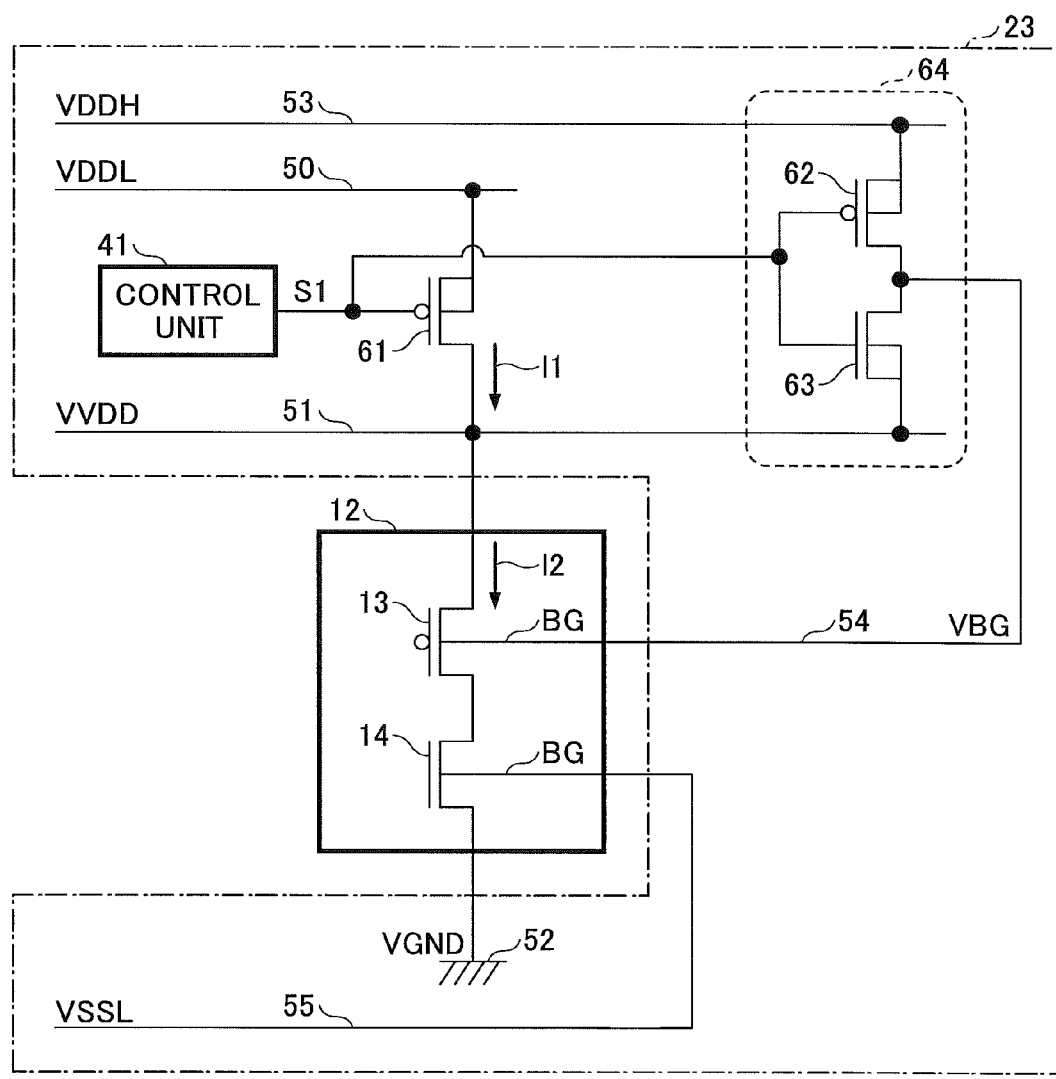
FIG. 6 is a drawing illustrating an example of the configuration of a semiconductor device.

FIG. 6 is a drawing illustrating an example of the configuration of a semiconductor device. Descriptions of configurations and functions identical or similar to those of the semiconductor device 101, 102 or 103 previously described will be incorporated herein.

A power supply control circuit 23 of a semiconductor device 104 differs from the power supply control circuit 22 of FIG. 5 in that no level shift circuit is provided. The fact that the pseudo power supply voltage VVDD varies may be utilized, and transistor characteristics may be optimized (e.g., lowering the threshold voltage of the NMOS transistor 63), thereby allowing the control unit 41 to control the CMOS inverter 64 without using a level shift circuit.

Figure 7A:
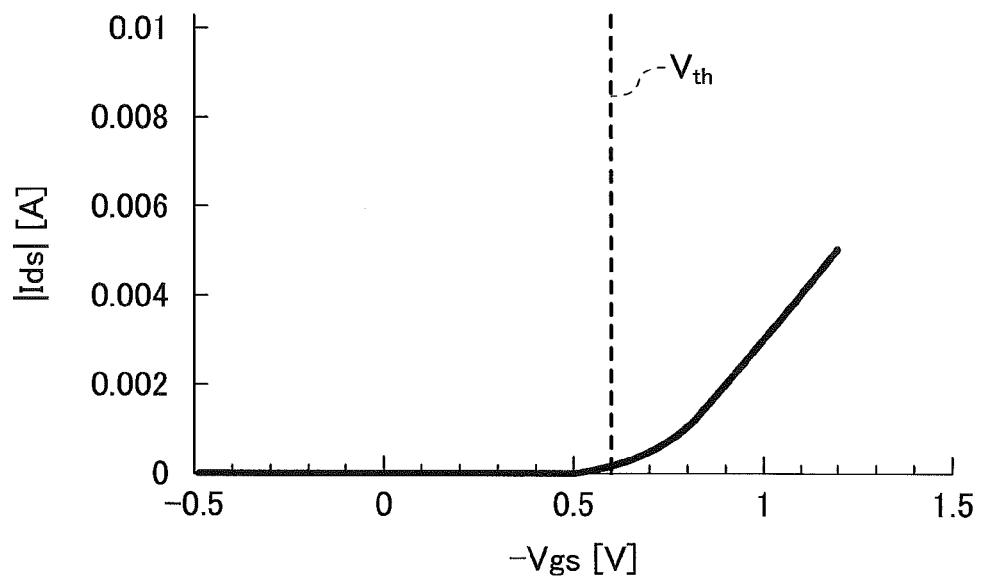
FIGS. 7A and 7B are drawings illustrating examples of transistor characteristics.
Figure 7B:
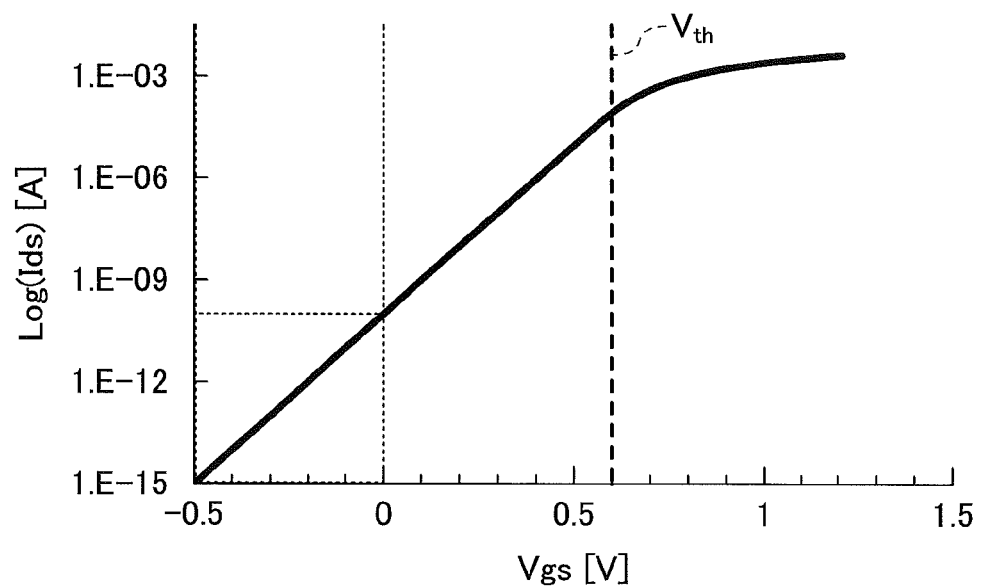

FIGS. 7A and 7B are drawings illustrating examples of transistor characteristics of a PMOS transistor and an NMOS transistor used in a CMOS inverter. FIG. 7A illustrates an example of the characteristics of the PMOS transistor when turned on, and FIG. 7B illustrates an example of the characteristics of the NMOS transistor when turned off. Vth represents the gate threshold voltage of each of the transistors. Vgs represents the voltage across the gate and source of each of the transistors. Ids represents the electric current flowing between the drain and source of each of the transistors. Log represents a common logarithm. $1 \cdot E - n$ (n: positive integer) represents $1.0 \times 10^{-n}$. Numerical values illustrated in the figures are merely examples given for the sake of convenience in order to provide easier understanding of the "on" and "off" operations of the transistors.

In the case of the voltage level of the control signal S1 being at the low level equal to the ground voltage VGND, the voltage Vgs of the PMOS transistor 62 of the CMOS inverter 64 is set to a voltage (VGND−VDDH) greater than the gate threshold voltage Vth, and, thus, the PMOS transistor 62 is turned on (see FIG. 7A). In the case of the voltage level of the control signal S1 being at the low level equal to the ground voltage VGND, the voltage Vgs of the NMOS transistor 63 of the CMOS inverter 64 is set to a negative voltage (VGND−VDDL) lower than the gate threshold voltage Vth, and, thus, the NMOS transistor 63 is turned off (see FIG. 7B). In this manner, the voltage Vgs of the NMOS transistor 63 is set to a negative voltage when the power gating function is in the "off" state. This serves to reduce the amount of leak current Ids of the NMOS transistor 63 as compared with the case in which the voltage Vgs is zero (see FIG. 7B). Further, the fact that the voltage Vgs of the NMOS transistor 63 is a negative voltage during the "off" state of the power gating function allows the NMOS transistor 63 to be properly turned off with low power consumption even in the case of the NMOS transistor 63 having a lower threshold value. The semiconductor device 104 thus achieves a reduction in power consumption.

Figure 8A:
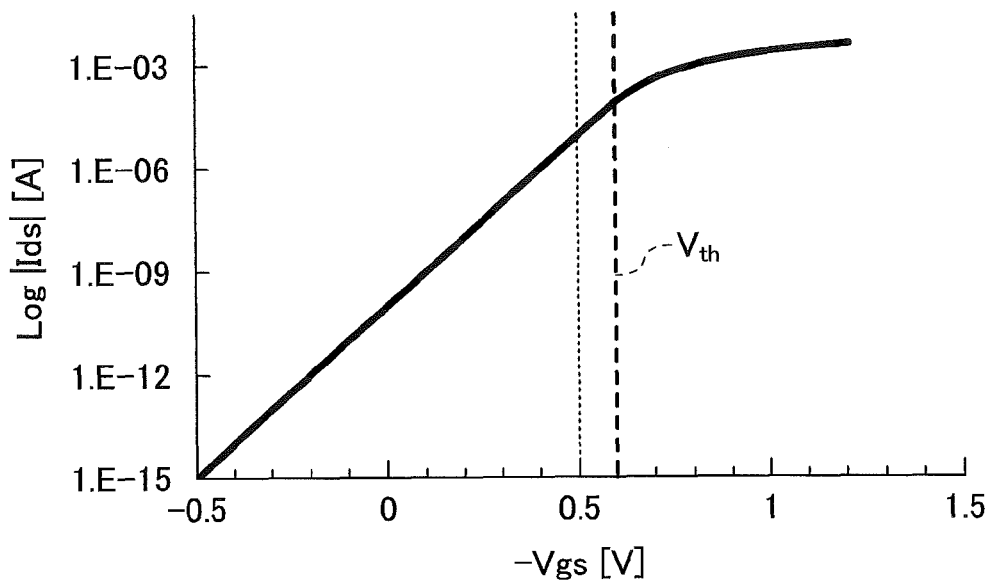
FIGS. 8A and 8B are drawings illustrating examples of transistor characteristics.
Figure 8B:
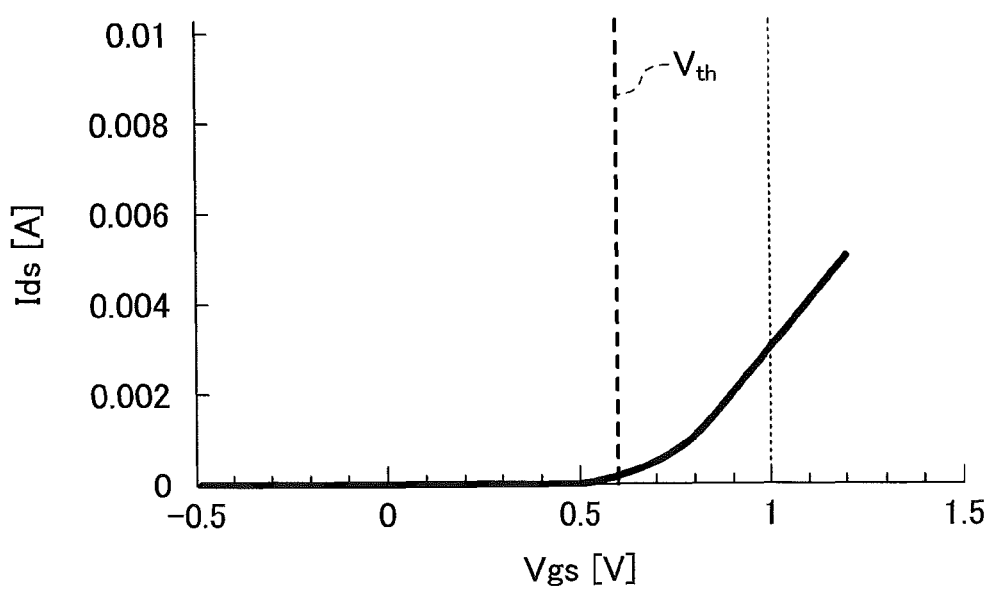

FIGS. 8A and 8B are drawings illustrating examples of transistor characteristics of a PMOS transistor and an NMOS transistor used in a CMOS inverter. FIG. 8A illustrates an example of the characteristics of the PMOS transistor when turned off, and FIG. 8B illustrates an example of the characteristics of the NMOS transistor when turned on. Vth represents the gate threshold voltage of each of the transistors. Vgs represents the voltage across the gate and source of each of the transistors. Ids represents the electric current flowing between the drain and source of each of the transistors. Log represents a common logarithm. $1 \cdot E - n$ (n: positive integer) represents $1.0 \times 10^{-n}$. Numerical values illustrated in the figures are merely examples given for the sake of convenience in order to provide easier understanding of the "on" and "off" operations of the transistors.

In the case of the voltage level of the control signal S1 being at the high level equal to the power supply voltage VDDL, the voltage Vgs of the PMOS transistor 62 of the CMOS inverter 64 is set to a voltage (VDDL−VDDH) smaller than the gate threshold voltage Vth, and, thus, the PMOS transistor 62 is turned off (see FIG. 8A). In the case of the voltage level of the control signal S1 being at the high level equal to the power supply voltage VDDL, the voltage Vgs of the NMOS transistor 63 of the CMOS inverter 64 is set to a voltage (VDDL−VGND) higher than the gate threshold voltage Vth, and, thus, the NMOS transistor 63 is turned on (see FIG. 8B).

The voltage Vgs of the PMOS transistor 62 is a voltage (VDDL−VDDH) smaller than the gate threshold voltage Vth, but is not zero. Because of this, the amount of a leak current Ids of the PMOS transistor 62 is greater than in the case of the voltage Vgs being zero.

In consideration of this, the absolute value of the gate threshold voltage Vth of the PMOS transistor 62 is set higher than the gate threshold voltage Vth of the NMOS transistor 63. With this arrangement, the characteristics of the PMOS transistor 62 when turned off are changed to those illustrated in FIG. 9.

Figure 9:
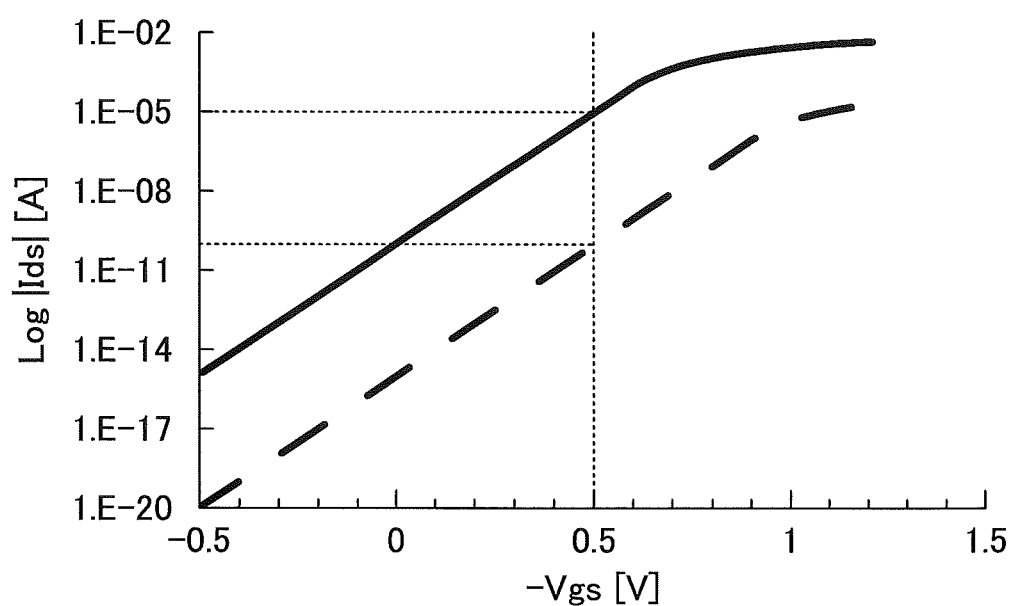
FIG. 9 is a drawing illustrating examples of transistor characteristics.

In FIG. 9, the solid line represents the characteristics that are observed when the absolute value of the gate threshold voltage Vth of the PMOS transistor 62 is the same (e.g., 0.6 V) as the gate threshold voltage Vth of the NMOS transistor 63. The dotted line indicates the characteristics that are observed when the absolute value of the gate threshold voltage Vth of the PMOS transistor 62 is higher than the gate threshold voltage Vth of the NMOS transistor 63 (e.g., when the absolute value of the gate threshold voltage Vth of the PMOS transistor 62 is 0.9 V while the gate threshold voltage Vth of the NMOS transistor 63 is 0.6 V).

As illustrated, the arrangement in which the absolute value of the gate threshold voltage Vth of the PMOS transistor 62 is set higher than the gate threshold voltage Vth of the NMOS transistor 63 serves to reduce the amount of a leak current Ids flowing through the PMOS transistor 62. Such a reduction is achieved at the same voltage Vgs of the PMOS transistor 62 relative to the case of using the same gate threshold voltage. The semiconductor device 104 thus achieves a reduction in power consumption.

Figure 10:
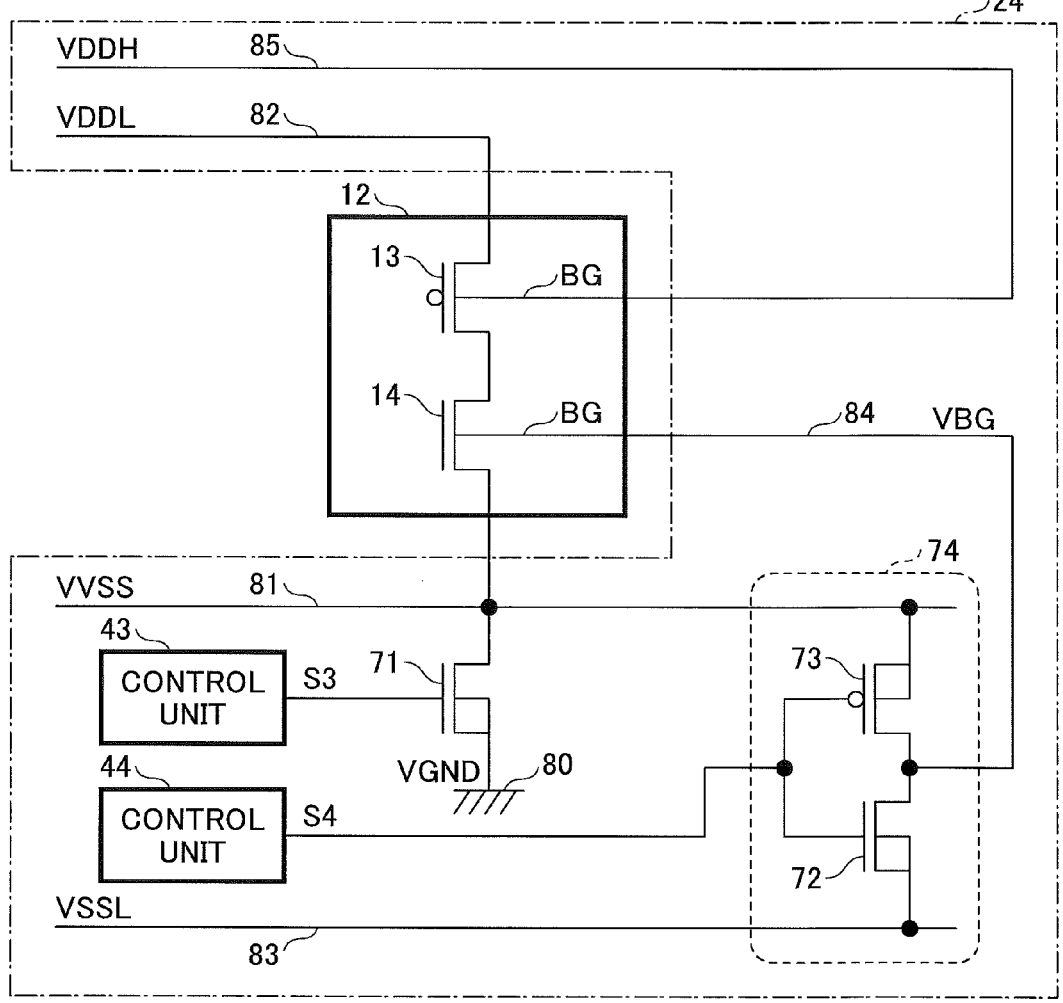
FIG. 10 is a drawing illustrating an example of the configuration of a semiconductor device.

FIG. 10 is a drawing illustrating an example of the configuration of a semiconductor device. Descriptions of configurations and functions identical or similar to those of the semiconductor devices 101 through 104 previously described will be incorporated herein.

In the semiconductor device 102 illustrated in FIG. 3, the switch (i.e., the PMOS transistor 61) for suspending power supply to the circuit block 12 is situated between the power supply 50 and the circuit block 12. In contrast, a semiconductor device 105 illustrated in FIG. 10 is configured such that the switch (i.e., an NMOS transistor 71) for suspending power supply to the circuit block 12 is situated between a ground 80 and the circuit block 12. The semiconductor device 105 includes the circuit block 12 and a power supply control circuit 24.

The power supply control circuit 24 serves to control power gating that suspends power supply to the circuit block 12. The power supply control circuit 24 includes an NMOS transistor 71, an NMOS transistor 72, a PMOS transistor 73, a control unit 43, and a control unit 44. The NMOS transistor 72 and the PMOS transistor 73 are transistors included in a CMOS inverter 74.

The NMOS transistor 71 is an example of a first switch that is situated between the ground 80 and a node 81. The NMOS transistor 71 may be a semiconductor switching device connected in series between the ground 80 and the node 81. The NMOS transistor 71 includes a gate coupled to the control unit 43, a source and a back gate coupled to the ground 80, and a drain coupled to the node 81.

The ground 80 is an example of the first power supply unit, and may be an earth ground having a ground voltage VGND. The ground 80 may be an electric conductive part such as a ground terminal, a ground line or a ground pattern.

The node 81 is an example of a first node that is coupled to the circuit block 12. The node 81 serves as a pseudo power supply coupled to the circuit block 12, and may be a pseudo electric conductive part such as a pseudo power supply terminal, a pseudo power supply line or a pseudo power supply pattern. The node 81 is coupled to a lower-potential-side current path through which a circuit current flowing out of the circuit block 12 flows. The node 81 is directly or indirectly coupled to the source of the NMOS transistor 14. The circuit block 12 is connected between the node 81 and a power supply 82.

The NMOS transistor 72 is an example of a second switch that is situated between a low-bias power supply 83 and a node 84. The NMOS transistor 72 may be a semiconductor switching device connected in series between the low-bias power supply 83 and the node 84. The NMOS transistor 72 includes a gate coupled to the control unit 44, a source and a back gate coupled to the low-bias power supply 83, and a drain coupled to the node 84.

The low-bias power supply 83 is an example of a second power supply having a different voltage value than the ground 80. The low-bias power supply 83 may be a low-potential power supply unit having a lower voltage value than the ground 80, and such a lower voltage value is a low-bias power supply voltage VSSL. The low-bias power supply 83 may be an electric conductive part such as a power supply terminal, a power supply line or a power supply pattern. The low-bias power supply voltage VSSL is a potential difference between the low-bias power supply 83 and the ground 80, and is a negative voltage lower than the ground voltage VGND.

The node 84 is an example of a second node that is coupled to the back gate BG of the NMOS transistor 14 in the circuit block 12. The node 84 serves as a voltage applying unit operable to apply a bias voltage VBG to the back gate BG of the NMOS transistor 14. The node 84 is an electric conductive part such as a terminal, a line or an electric conductive pattern.

The PMOS transistor 73 is an example of a third switch that is situated between the node 81 and the node 84. The PMOS transistor 73 may be a semiconductor switching device connected in series between the node 81 and the node 84. The PMOS transistor 73 includes a gate coupled to the control unit 44, a source and a back gate coupled to the node 81, and a drain coupled to the node 84.

The circuit block 12 is an example of a combinatorial circuit that includes the PMOS transistor 13 and the NMOS transistor 14. The NMOS transistor 14 has a source coupled to the node 81, a drain coupled to the drain of the PMOS transistor 13, and a back gate BG coupled to the node 84. The PMOS transistor 13 has a source coupled to the power supply 82, a drain coupled to the drain of the NMOS transistor 14, and a back gate BG coupled to a high-bias power supply 85.

The power supply 82 may be a low-potential power supply unit supplying direct-current power at the power supply voltage VDDL. The power supply 82 may be an electric conductive part such as a power supply terminal, a power supply line or a power supply pattern. The power supply voltage VDDL is a potential difference between the power supply 82 and the ground 80.

The high-bias power supply 85 is a high-potential power supply having a voltage value higher than the VDDL 82, and has a high-bias power supply voltage VDDH that is applied to the back gate BG of the PMOS transistor 13. The high-bias power supply 85 may be an electric conductive part such as a power supply terminal, a power supply line or a power supply pattern. The high-bias power supply voltage VDDH is a potential difference between the high-bias power supply 85 and the ground 80, and is higher than the power supply voltage VDDL.

The control unit 43 serves to output a control signal S3 for driving the NMOS transistor 71. The control unit 44 serves to output a control signal S4 for driving the CMOS inverter 74. The control unit 44 turns on the NMOS transistor 72 and turns off the PMOS transistor 73 in the case of the control unit 43 turning on the NMOS transistor 71. The control unit 44 turns of the NMOS transistor 72 and turns on the PMOS transistor 73 in the case of the control unit 43 turning off the NMOS transistor 71.

The control unit 43 may be a PMU receiving electric power from the power supply 82 and the ground 80, and operates with a power supply voltage (VDDL−VGND). Operating with the power supply voltage (VDDL−VGND) rather than the high-bias power supply voltage VDDH, the control unit 43 supplies to the gate of the NMOS transistor 71 the control signal S3 whose high level is equal to the power supply voltage VDDL. Since the operating voltage of the control unit 43 is the power supply voltage (VDDL–VGND), the high level of the control signal S3 is equal to the power supply voltage VDDL. The fact that the control unit 43 operates with the power supply voltage (VDDL–VGND) allows the breakdown voltage of the gate of the NMOS transistor 71 to be lower than the high-bias power supply voltage VDDH.

The control unit 44 may be a PMU receiving electric power from the power supply 82 and the low-bias power supply 83, and operates with a power supply voltage (VDDL–VSSL). Operating with the power supply voltage (VDDL–VSSL), the control unit 44 supplies to the gate of the NMOS transistor 72 and to the gate of the PMOS transistor 73 the control signal S4 whose high level is equal to the power supply voltage VDDL.

The "on" state of the NMOS transistor 71 causes a pseudo power supply voltage VVSS of the node 81 to be set equal to the ground voltage VGND, thereby causing the power supply voltage VDDL to be applied to the circuit block 12. Since the power of the power supply voltage VDDL is being supplied to the circuit block 12, the power gating function for the circuit block 12 is in an "off" state. When the NMOS transistor 71 is turned on, the NMOS transistor 72 is turned on, and the PMOS transistor 73 is turned off. As a result, the bias voltage VBG of the node 84 is set equal to the low-bias power supply voltage VSSL, which causes the low-bias power supply voltage VSSL to be applied to the back gate BG of the NMOS transistor 14.

The "off" state of the NMOS transistor 71 causes the pseudo power supply voltage VVSS of the node 81 to be set equal to the power supply voltage VDDL, thereby causing approximately zero volt to be applied to the circuit block 12. Since no power is being supplied to the circuit block 12, the power gating function for the circuit block 12 is in an "on" state. When the NMOS transistor 71 is turned off, the NMOS transistor 72 is turned off, and the PMOS transistor 73 is turned on. This results in the bias voltage VBG of the node 84 being set to the same voltage as the pseudo power supply voltage VVSS. The "off" state of the NMOS transistor 71 causes the pseudo power supply voltage VVSS to be set equal to the power supply voltage VDDL, thereby setting the bias voltage VBG to the power supply voltage VDDL. As a result, the power supply voltage VDDL is applied to the back gate BG of the NMOS transistor 14.

Accordingly, with the power gating function of the circuit block 12 being in the "on" state due to the "on" state of the NMOS transistor 71, the source and the drain of the NMOS transistor 14 are both set to the power supply voltage VDDL, and the back gate BG thereof is also set to the power supply voltage VDDL. The voltage between the back gate BG and the source S and the voltage between the back gate BG and the drain D are both set substantially equal to zero volt. This arrangement suppresses leak currents flowing through the junction point between the back gate BG and the source and flowing through the junction point between the back gate BG and the drain. The semiconductor device 105 thus achieves a reduction in power consumption.

The PMOS transistor 73 is in the "on" state when the NMOS transistor 72 is in the "off" state. In this case, the back gate BG of the NMOS transistor 14 is not set to a floating potential, but is set to the pseudo power supply voltage VVSS (which is equal to the power supply voltage VDDL due to the "off" state of the NMOS transistor 71). This arrangement prevents noise from being easily superimposed on the node 84 or the back gate BG of the NMOS transistor 14, thereby preventing the occurrence of latch-up resulting from such noise.

Figure 11:
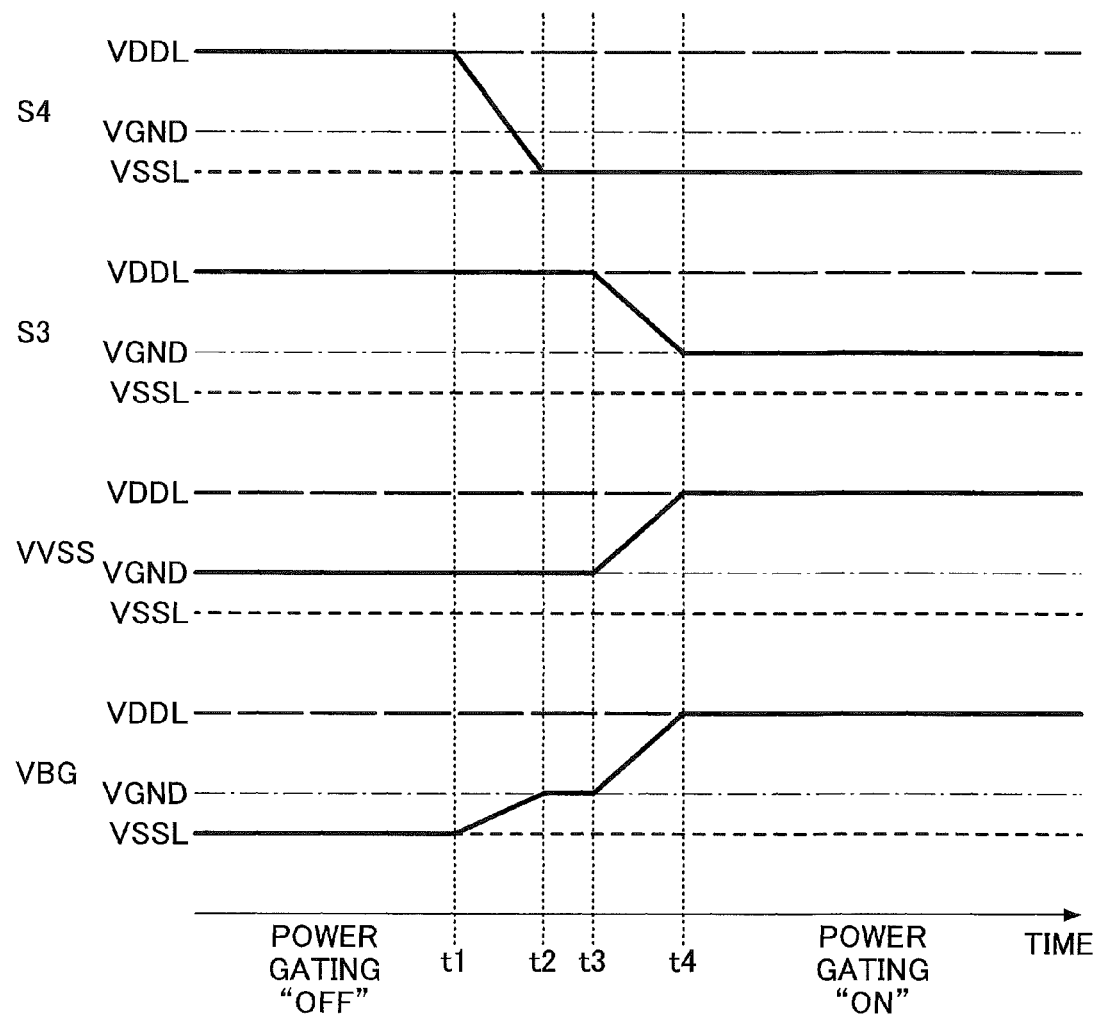
FIG. 11 is a timing chart illustrating an example of the operation of the semiconductor device illustrated in FIG. 10.

FIG. 11 is a timing chart illustrating an example of the operation of the semiconductor device 105. A description of FIG. 11 will be given by referring to FIG. 10.

The power supply voltage VDDL may be 1.0 V. The ground voltage VGND may be 0 V. The low-bias power supply voltage VSSL may be −0.5 V. The gate threshold voltage of each transistor may be 0.6 V.

As in the case illustrated in FIG. 3, electric power is supplied to the circuit block 12 during the period preceding timing t1 in which the voltage level of the control signal S3 is at the high level equal to the power supply voltage VDDL. In this case, the power gating function is in the "off" state. On the other hand, electric power is not supplied to the circuit block 12 during the period following timing t4 in which the voltage level of the control signal S3 is at the low level equal to the ground voltage VGND. In this case, the power gating function is in the "on" state.

Accordingly, with the power gating function of the circuit block 12 being in the "on" state, the source and the drain of the NMOS transistor 14 are both set to the power supply voltage VDDL, and the back gate BG thereof is also set to the power supply voltage VDDL. The voltage between the back gate BG and the source S and the voltage between the back gate BG and the drain D are both set substantially equal to zero volt. This arrangement suppresses leak currents flowing through the junction point between the back gate BG and the source and flowing through the junction point between the back gate BG and the drain. The semiconductor device 105 thus achieves a reduction in power consumption.

Figure 12:
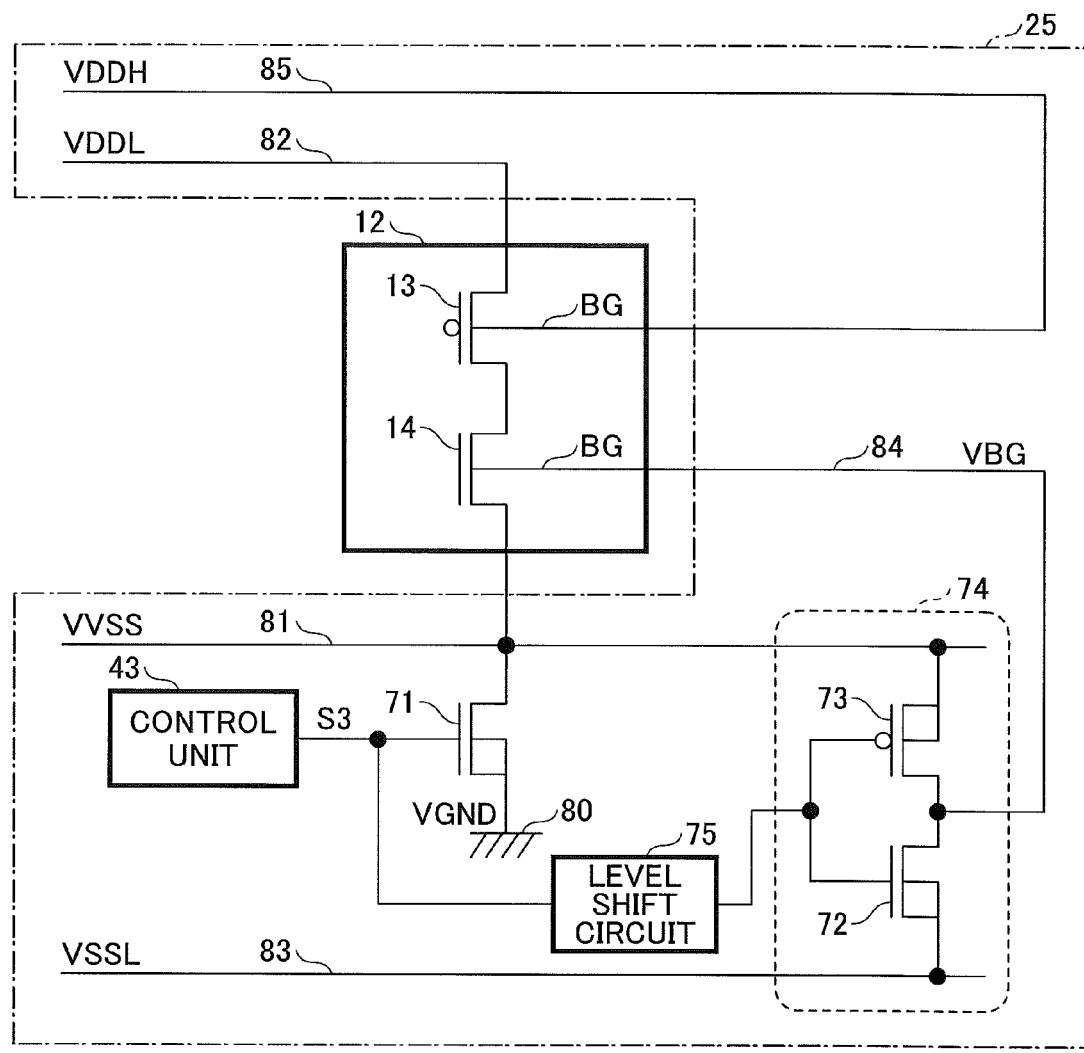
FIG. 12 is a drawing illustrating an example of the configuration of a semiconductor device.

FIG. 12 is a drawing illustrating an example of the configuration of a semiconductor device. Descriptions of configurations and functions identical or similar to those of the semiconductor device 101 through 105 previously described will be incorporated herein.

The control unit 43 outputs the control signal S3 for driving both the NMOS transistor 71 and the CMOS inverter 74. The sharing of the control signal S3 allows the single control unit 43 to perform both the control to shut the flow of current from the power supply 82 to the node 81 and the control to shut the flow of current from the node 84 to the low-bias power supply 83. In other words, the number of control units is reduced despite the multiplicity of systems in which the flow of electric current should be suspended. This also contributes to a reduction in the power consumption of the semiconductor device 106.

The semiconductor device 106 has a level shift circuit 75 situated between the control unit 43 and the CMOS inverter 74. The level shift circuit 75 shifts the voltage of the low level of the control signal S3 applied to the CMOS inverter 74 such that the voltage is changed from the ground voltage VGND to the low-bias power supply voltage VSSL. With this arrangement, an erroneous "on" state of the NMOS transistor 72 due to the excessively high potential applied to the gate of the NMOS transistor 72 of the CMOS inverter 74 can be prevented when the NMOS transistor 71 is in the "off" state. Namely, an increase of the leak current flowing into the back gate BG of the NMOS transistor 14 caused by the erroneous "on" state of the NMOS transistor 72 is avoided or suppressed.

Figure 13:
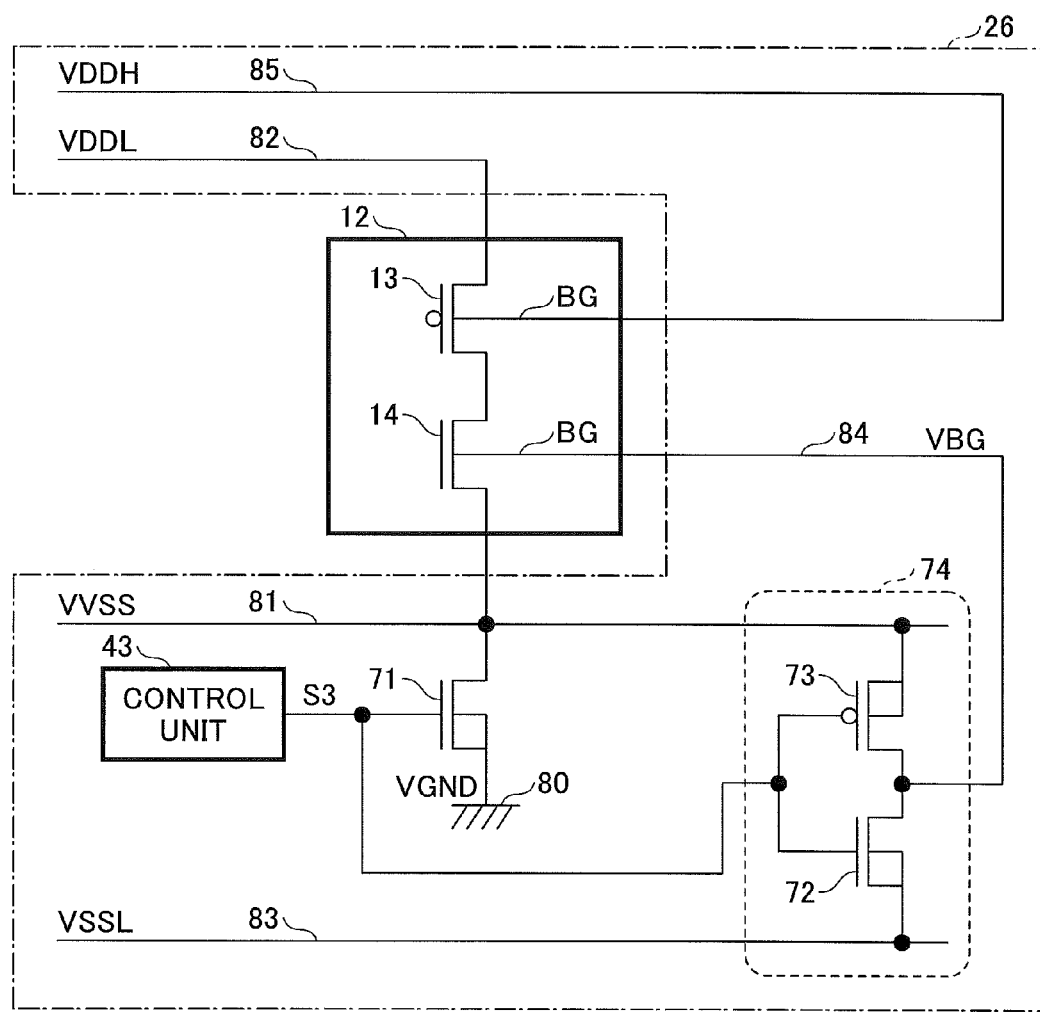
FIG. 13 is a drawing illustrating an example of the configuration of a semiconductor device.

FIG. 13 is a drawing illustrating an example of the configuration of a semiconductor device. Descriptions of configurations and functions identical or similar to those of the semiconductor device 101 through 106 previously described will be incorporated herein.

A power supply control circuit 26 of a semiconductor device 107 differs from the power supply control circuit 25 of FIG. 12 in that no level shift circuit is provided. The fact that the pseudo power supply voltage VVSS varies may be utilized, and transistor characteristics may be optimized (e.g., lowering the threshold voltage of the PMOS transistor 73), thereby allowing the control unit 43 to control the CMOS inverter 74 without using a level shift circuit.

In the case of the voltage level of the control signal S3 being at the low level equal to the ground voltage VGND, the voltage Vgs of the NMOS transistor 72 of the CMOS inverter 74 is set to a voltage (VGND−VSSL) lower than the gate threshold voltage Vth, and, thus, the NMOS transistor 72 is turned off. In the case of the voltage level of the control signal S3 being at the low level equal to the ground voltage VGND, the voltage Vgs of the PMOS transistor 73 of the CMOS inverter 74 is set to a voltage (VGND−VDDL) greater than the gate threshold voltage Vth, and, thus, the PMOS transistor 73 is turned on.

The voltage Vgs of the NMOS transistor 72 is a voltage (VGND−VSSL) smaller than the gate threshold voltage Vth, but is not zero. Because of this, the amount of a leak current Ids of the NMOS transistor 72 is greater than in the case of the voltage Vgs being zero.

In consideration of this, the absolute value of the gate threshold voltage Vth of the NMOS transistor 72 is set higher than the absolute value of the gate threshold voltage Vth of the PMOS transistor 73. This serves to reduce the amount of a leak current Ids flowing through the NMOS transistor 72. The semiconductor device 107 thus achieves a reduction in power consumption.

Although the power supply control circuits and semiconductor devices have been described by referring to embodiments, the present invention is not limited to these embodiments. Various modifications and improvements such as combining an embodiment partially or entirely with one or more other embodiments or replacing part of an embodiment with part of another embodiment may be made without departing from the scope of the present invention.

For example, one of the configurations illustrated in FIG. 3, FIG. 5 and FIG. 6 may be combined with one of the configurations illustrated in FIG. 10, FIG. 12 and FIG. 13. Namely, provision may be made such that the control of supply and suspension of electric power to a circuit block may be performed at both the upstream side and the downstream side of the circuit block subjected to power gating.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A circuit for controlling power supply, comprising:
a first switch situated between a first power supply and a first node coupled to a circuit block;
a second switch situated between a second power supply having a voltage value different than the first power supply and a second node coupled to a back gate of a transistor of the circuit block;
a third switch situated between the first node and the second node; and
a control unit configured to place, during an "on" state of the first switch, the second switch in an "on" state and the third switch in an "off" state, and to place, during an "off" state of the first switch, the second switch in an "off" state and the third switch in an "on" state, wherein the first switch is a transistor whose back gate is connected to the first power supply.

2. The circuit as claimed in claim 1, wherein the second switch and the third switch are transistors of a CMOS inverter.

3. The circuit as claimed in claim 2, wherein the control unit is configured to output a control signal that drives both the first switch and the CMOS inverter.

4. The circuit as claimed in claim 3, further comprising a level shift circuit configured to shift a level of the control signal and connected between the control unit and the CMOS inverter.

5. The circuit as claimed in claim 2, wherein the third switch is an NMOS transistor, and the second switch is a PMOS transistor having a gate threshold voltage whose absolute value is larger than a gate threshold voltage of the NMOS transistor.

6. The circuit as claimed in claim 2, wherein the third switch is a PMOS transistor, and the second switch is an NMOS transistor having a gate threshold voltage that is larger than an absolute value of a gate threshold voltage of the PMOS transistor.

7. The circuit as claimed in claim 1, wherein
a power supply voltage of the second power supply is higher than a power supply voltage of the first power supply, and the second switch and the third switch are a PMOS transistor and an NMOS transistor, respectively.

8. The circuit as claimed in claim 1, wherein a power supply voltage of the second power supply is lower than a power supply voltage of the first power supply, and the second switch and the third switch are an NMOS transistor and a PMOS transistor, respectively.

9. A semiconductor device, comprising:
a circuit block;
a first switch situated between a first power supply and a first node coupled to the circuit block;
a second switch situated between a second power supply having a voltage value different than the first power supply and a second node coupled to a back gate of a transistor of the circuit block;
a third switch situated between the first switch and the second switch; and
a control unit configured to place, during an "on" state of the first switch, the second switch in an "on" state and the third switch in an "off" state, and to place, during an "off" state of the first switch, the second switch in an "off" state and the third switch in an "on" state, wherein the first switch is a transistor whose back gate is connected to the first power supply.

10. The semiconductor device as claimed in claim 9, wherein a power supply voltage of the second power supply is higher than a power supply voltage of the first power supply, and the second switch and the third switch are a PMOS transistor and an NMOS transistor, respectively, and wherein the transistor of the circuit block is a PMOS transistor.

11. The semiconductor device as claimed in claim 9, wherein a power supply voltage of the second power supply is lower than a power supply voltage of the first power supply, and the second switch and the third switch are an NMOS transistor and a PMOS transistor, respectively, and wherein the transistor of the circuit block is an NMOS transistor.

* * * * *